(12) United States Patent
Belmas et al.

(10) Patent No.: US 9,246,456 B2
(45) Date of Patent: Jan. 26, 2016

(54) AMPLIFICATION CIRCUIT AND RECEPTION CHAIN

(75) Inventors: François Belmas, Saze (FR); Frédéric Hameau, Saint Nizier du Moucherotte (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/113,097

(22) PCT Filed: May 3, 2012

(86) PCT No.: PCT/FR2012/050992
§ 371 (c)(1),
(2), (4) Date: Oct. 21, 2013

(87) PCT Pub. No.: WO2012/150420
PCT Pub. Date: Nov. 8, 2012

(65) Prior Publication Data
US 2014/0049319 A1 Feb. 20, 2014

(30) Foreign Application Priority Data

May 5, 2011 (FR) ...................... 11 53859

(51) Int. Cl.
*H03F 3/45* (2006.01)
*H03G 3/30* (2006.01)
*H03F 3/68* (2006.01)
*H03F 3/193* (2006.01)
*H03G 3/00* (2006.01)

(52) U.S. Cl.
CPC .................. *H03F 3/68* (2013.01); *H03F 3/193* (2013.01); *H03F 3/45* (2013.01); *H03F 3/45076* (2013.01); *H03G 3/004* (2013.01)

(58) Field of Classification Search
CPC ....................................................... H03G 3/30
USPC ......................................... 330/136, 254, 285
See application file for complete search history.

(56) References Cited

U.S. PATENT DOCUMENTS

| 2007/0057724 A1 | 3/2007 | Koizumi et al. |
| 2007/0176679 A1 * | 8/2007 | Kluge ........................... 330/253 |
| 2009/0108935 A1 | 4/2009 | Kuo et al. |

OTHER PUBLICATIONS

International Search Report Issued Aug. 23, 2012 in PCT/FR12/50992 Filed May 3, 2012.

* cited by examiner

*Primary Examiner* — Steven J Mottola
(74) *Attorney, Agent, or Firm* — Oblon, McClelland, Maier & Neustadt, L.L.P.

(57) ABSTRACT

An amplification circuit including: an input for receiving an input voltage; an output for exhibiting an output voltage; a primary amplifier configured to receive the input voltage from the input, receive a primary control voltage, first amplify the input voltage by a primary gain dependent on the control voltage, the output voltage corresponding to the first amplified input voltage, and supply the output voltage to the output; and a secondary amplifier configured to receive the input voltage from the input, second amplify the input voltage by a secondary gain, the primary control voltage corresponding to the second amplified input voltage, and supply the primary control voltage to the primary amplifier. The secondary amplifier has in operation an input admittance of at least 1 millisiemens.

11 Claims, 7 Drawing Sheets

AMPLIFICATION CIRCUIT AND RECEPTION CHAIN

Figure 1:
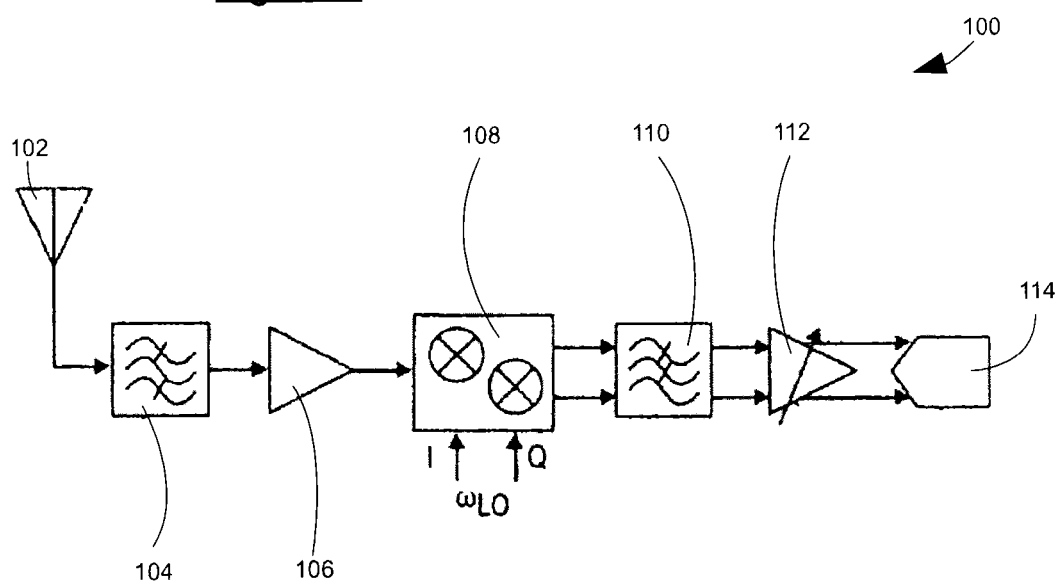

The present invention relates to an amplification circuit and a reception chain.

In the context of the present invention, the term "amplification circuit" will refer to any circuit having an output signal corresponding to the input signal multiplied by a multiplication value suitable for adopting, in absolute terms, any positive value, and particularly any value between 0 and 1. This multiplication value will be referred to as the "gain". The terms "amplification circuit" and "gain" will thus be used even if, in strict terms, when the gain is between 0 and 1, the output signal is reduced in amplitude relative to the input signal.

The aim of a low noise amplification circuit, also referred to using the acronym LNA (from "Low Noise Amplifier"), is that of amplifying an input signal while minimising the degradation thereof.

To quantify the noise of an LNA, the use of a measurement of the degradation of the "difference between a useful signal and a noise floor" is known. The LNA output signal contains three components: the useful input signal amplified by the LNA gain, the input noise amplified by the LNA gain and the internal noise of the LNA components injected directly to the output.

The manner in which the LNA injects an output noise will therefore have an impact on the difference between the useful signal and the noise with the following impassable limits: if the input signal power is less than the noise floor power then the signal is "lost" in the ambient noise and the LNA would never be able to detect the useful signal from the ambient noise, and if the internal noise injected by the LNA at the output is greater than the amplified useful signal, then the LNA drowns the signal with the internal noise thereof.

Between these two extreme scenarios, the LNA amplifies the input signal and the input noise by reducing the difference between these two quantities slightly. The LNA thus has an impact on the signal to noise ratio, which is quantified by a noise factor F defined as follows:

$$F = \frac{S/N_{input}}{S/N_{output}} > 1$$

$$NF = 10 \log_{10}(F) > 0 \text{ dB}$$

where $S/N_{input}$ (or $S/N_{output}$) is the signal to noise ratio at the input (respectively output). NF is the "noise figure", i.e. the noise factor F on a logarithmic scale.

Since an LNA always has minimum noise, $S/N_{output}$ is always less than $S/N_{input}$, such that F is strictly greater than 1 and NF strictly greater than 0 dB.

An LNA is an amplifier of which the noise figure NF is less than 10 dB, preferably less than 7 dB, and more preferably between 1 and 3 dB so as to correspond to the standard values of LNA noise figures NF according to the prior art. When the noise figure NF is less than 1 dB, the electricity consumption of the LNA generally becomes higher (more than some ten milliwatts).

It is frequently necessary, particularly in radiofrequency circuits, to adapt the impedances between the blocks to prevent parasitic reflections of the signals that give rise to further losses of power. The most common standard sets the LNA input impedance to 50Ω. This value is generally considered to be a low impedance. One of the design issues in respect of LNAs consists of ensuring that they have an impedance of 50Ω with a low electricity consumption.

To adapt the LNA to a low impedance, minimise the internal noise thereof, its distortion and maximise its gain, the use of passive inductors is known. More specifically, three inductors are positioned around a field-effect transistor, each offering a particular advantage from those cited at the start of the paragraph.

The main failing of these inductors relates to the surface area required for the production thereof. This involves components occupying a very large plane surface area relative to that occupied by the transistors, which are nanometric in size.

The cost of a circuit is essentially associated with the technology used and the surface area of the circuit. Since modern technologies have an increasingly high cost per $mm^2$, it becomes necessary to minimise the use of passive inductors.

In the years 1998-2000, a technique was described in relation to differential input LNA based on common-gate field-effect transistors. This technique, referred to as the Capacitive Cross Coupling Technique or CCCT, schematically proposes to control a transistor by simultaneously actuating the source thereof and the gate thereof by means of a single coupling capacitor, ensuring that the source and gate voltages are 180° phase shifted. This technique makes it possible to increase the effective transconductance of the transistor in a common-gate assembly without increasing the direct current used to create the transconductance. However, in that the intrinsic gain of the coupling capacitor has an absolute value equal to 1, this technique is not suitable for obtaining an effective transconductance which is greater than the natural transconductance of the transistor multiplied by 2.

Examples of CCCT are described in the following publications:

S. B. T Wang, A. M. Niknejad, R. W. Brodersen, "Design of a Sub-mW 960-MHz UWB CMOS LNA," IEEE JSSC, vol. 41 no. 11. November 2006, W. Zhuo, S. Embabi, J. P. De Gyvez, E. Sanchez-Sinencio, "Using Capacitive Cross-Coupling Technique in RF Low Noise Amplifiers and Down-Conversion Mixer Design," IEEE ESSCIRC, pp. 77-80, May 2000, and Woo, S. Kim, and al. "A 3.6 mW Differential Common Gate CMOS LNA with Positive-Negative Feedback," IEEE ISSCC, pp. 218-219, February 2009.

There are also some documents proposing the use of an active or passive amplifier rather than the coupling capacitor used in the CCCT technique. Particular mention may be made of:

H. Wang, L. Zhang, Z. Yu, "A Wideband Inductorless LNA With Local Feedback and Noise Cancelling for Low-Power Low-Voltage Applications," IEEE TCAS I, vol. 57 no. 8, August 2010, X. Li, S. Shekhar, D. J. Allstot, "Gm-boosted Common-Gate LNA and Differential Colpitts VCO/QVCO in 0.18-μm CMOS," IEEE JSSC, vol. 40 no. 12—December 2005, and I. R. Chamas, S. Raman, "Analysis, Design, and X-Band Implementation of a Self-Biased Active Feedback $g_m$-Boosted, Common-Gate CMOS LNA," IEEE MTT, vol. 57 no. 3, March 2009.

The use of an amplifier wherein the gain is greater, in absolute terms, than 1 makes it possible to increase the effective transconductance of the transistor by more than a factor of 2, unlike the use of the CCCT technique.

This increase in transconductance increases the LNA input admittance (which reduces the input impedance of the LNA).

The aim of the invention is that of proposing an amplification circuit suitable for enhancing the input admittance to electricity consumption ratio of an amplification circuit further.

For this, it relates to an amplification circuit comprising: an input for receiving an input voltage, an output for exhibiting an output voltage, a primary amplifier designed to receive the input voltage from the input, receive a primary control voltage, amplify the input voltage by a primary gain dependent on the control voltage, the output voltage corresponding to the input voltage amplified this way, supply the output voltage to the output, and a secondary amplifier designed to: receive the input voltage from the input, amplify the input voltage by a secondary gain, the primary control voltage corresponding to the input voltage amplified this way, supply the primary control voltage to the primary amplifier, the secondary amplifier having in operation an input admittance of at least 1 millisiemens.

In the proposed circuit, the input admittance is distributed between at least two admittances: the primary admittance and the secondary admittance, whereas, in the prior art, only the primary admittance contributes to the amplification circuit input admittance. However, the inventors discovered that this distribution made it possible to obtain a satisfactory input admittance to electricity consumption ratio. Indeed, as a general rule, the admittance does not vary linearly as a function of the electricity consumption of the amplification device. In other words, the increase in the electricity consumption required to increase the admittance rises with the level of the admittance. In this way, it is more advantageous to envisage a plurality of low admittances in combination rather than a single high admittance. It is thus, for example, possible to increase the input admittance further (and thus obtain an even lower input impedance) at a constant consumption. Similarly, it is for example possible at a constant input admittance (i.e. at a constant input impedance, for example 50Ω) to reduce the electricity consumption of the amplification circuit further.

Optionally, the primary amplifier has, in operation, an input admittance of at least 1 millisiemens.

Also optionally, the secondary gain is strictly greater in absolute terms than 1.

Also optionally, the secondary amplifier is designed to receive a secondary control voltage, the secondary gain is dependent on the secondary control voltage, and the amplification circuit further comprises a tertiary amplifier designed to amplify a tertiary input voltage dependent on the input voltage by a tertiary gain, the secondary control voltage corresponding to the tertiary input voltage amplified this way.

Also optionally, the tertiary gain is equal in absolute terms to 1.

Also optionally, the tertiary gain is strictly less in absolute terms than 1.

Also optionally, the tertiary input voltage is the input voltage.

Also optionally, the tertiary input voltage is the output voltage.

Also optionally, the input voltage and/or the output voltage is/are in differential form.

The invention also relates to a reception chain comprising: an antenna designed to receive a radiofrequency signal and convert same into an antenna voltage, and an amplification circuit according to the invention, designed to receive an input voltage from the antenna voltage.

Figure 2:
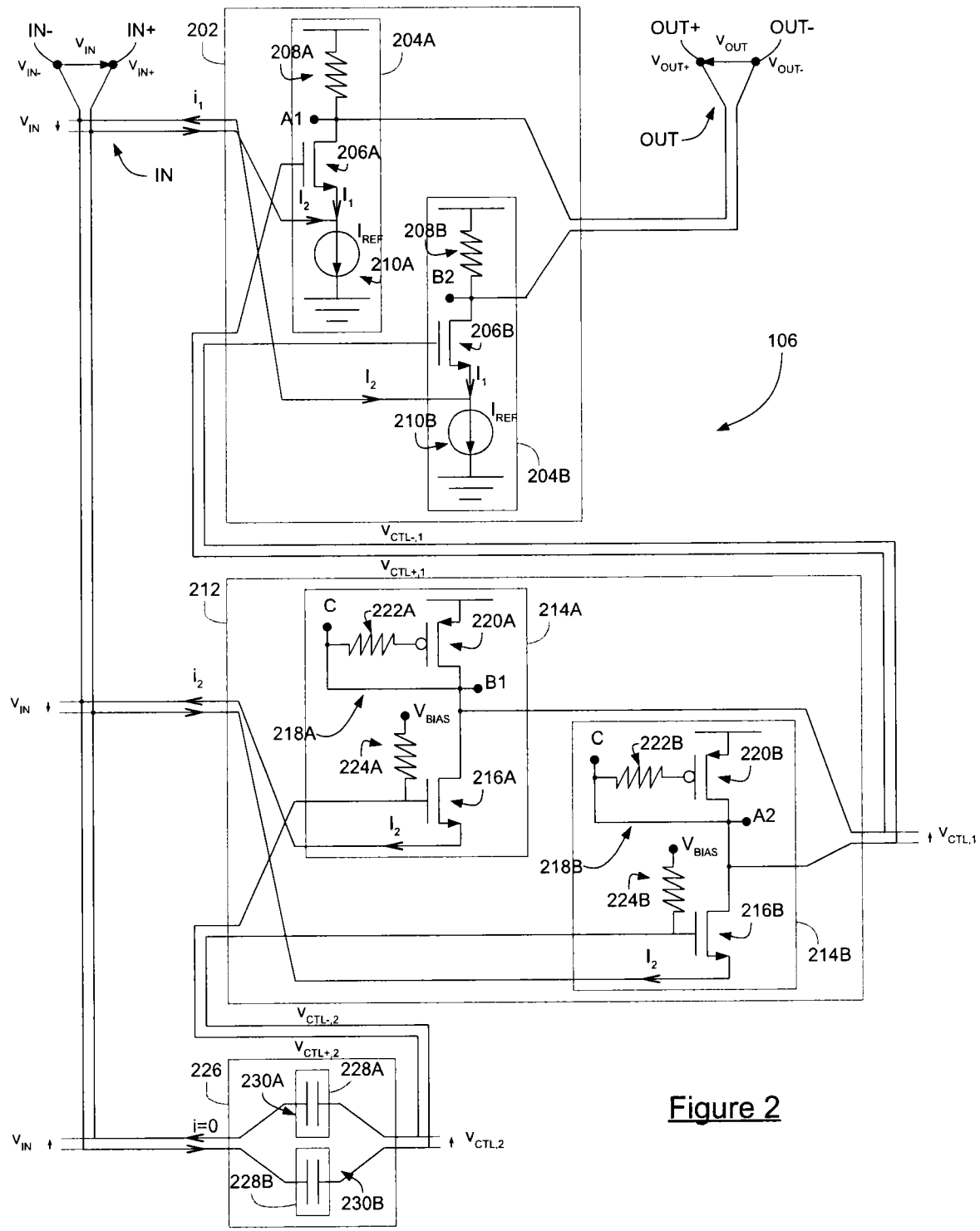
Figure 3:
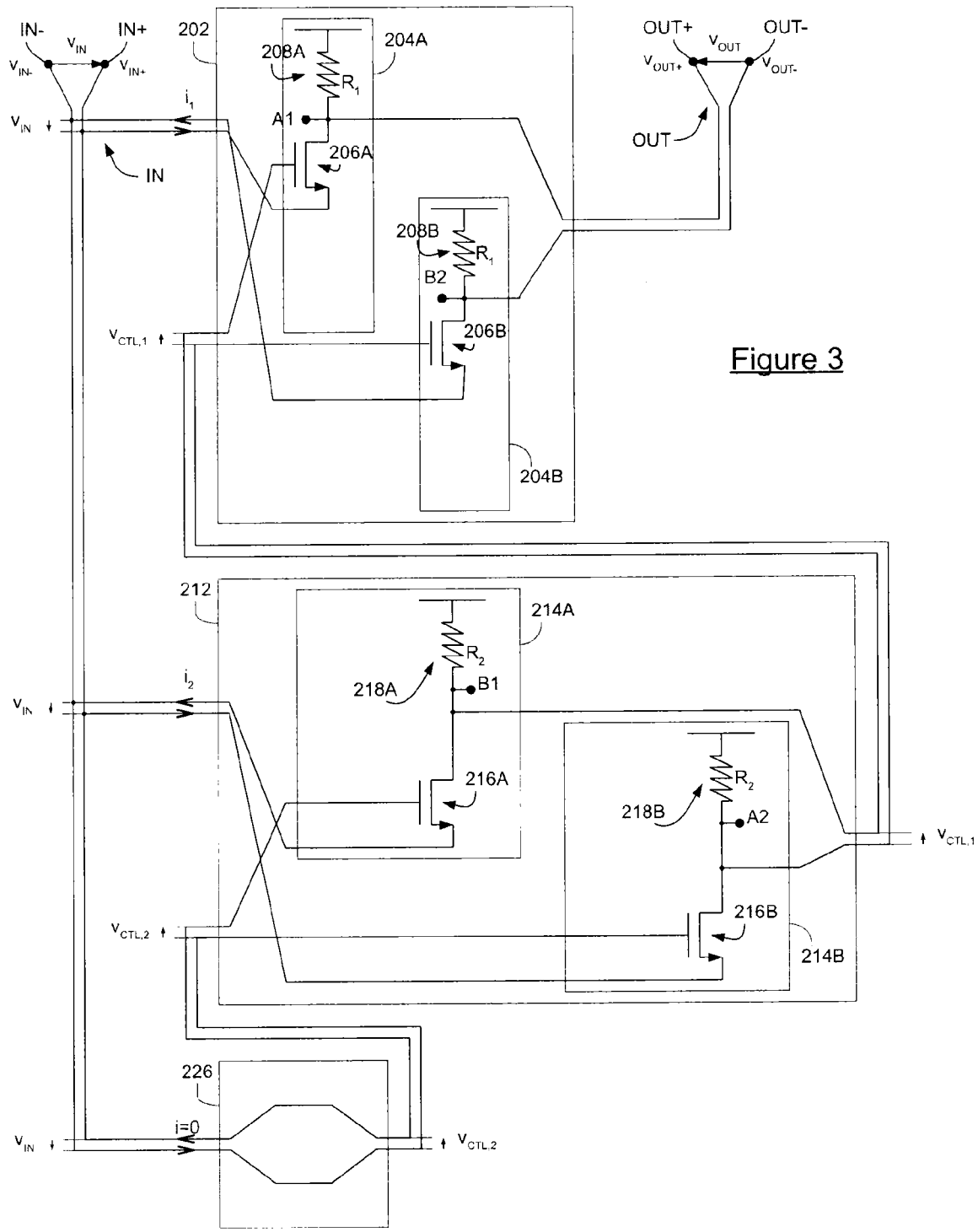
Figure 4:
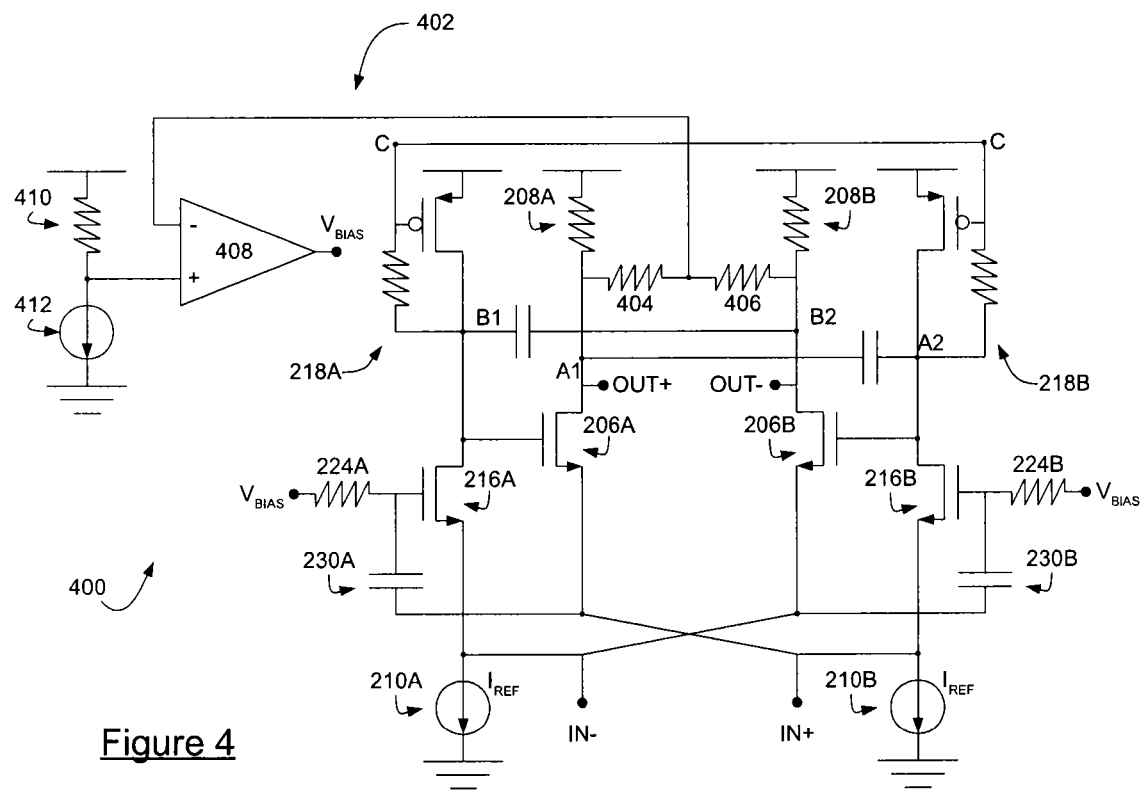
Figure 5:
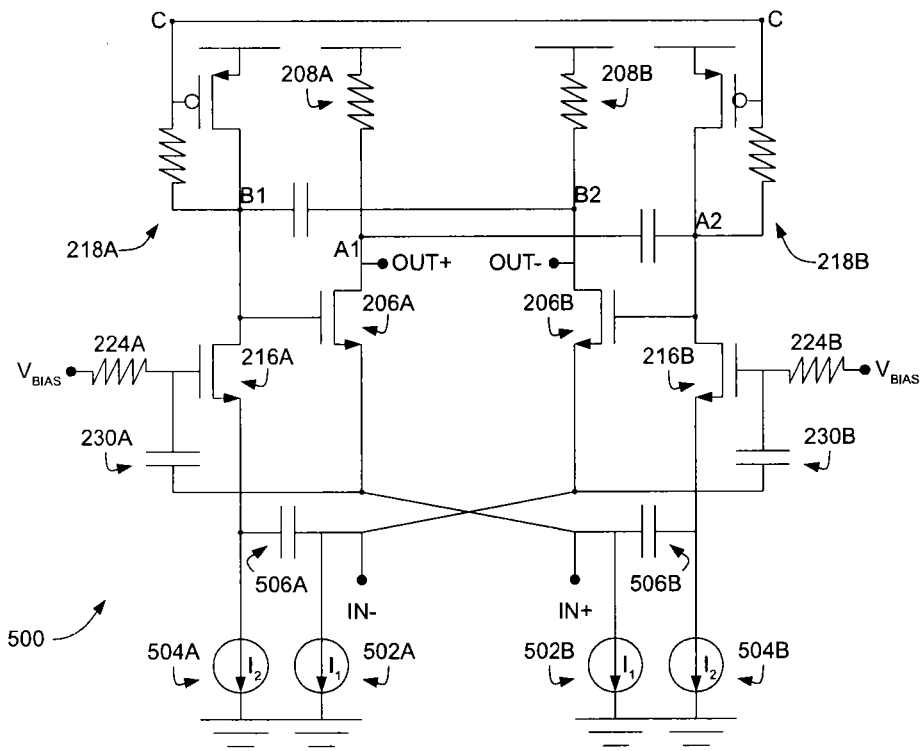
Figure 6:
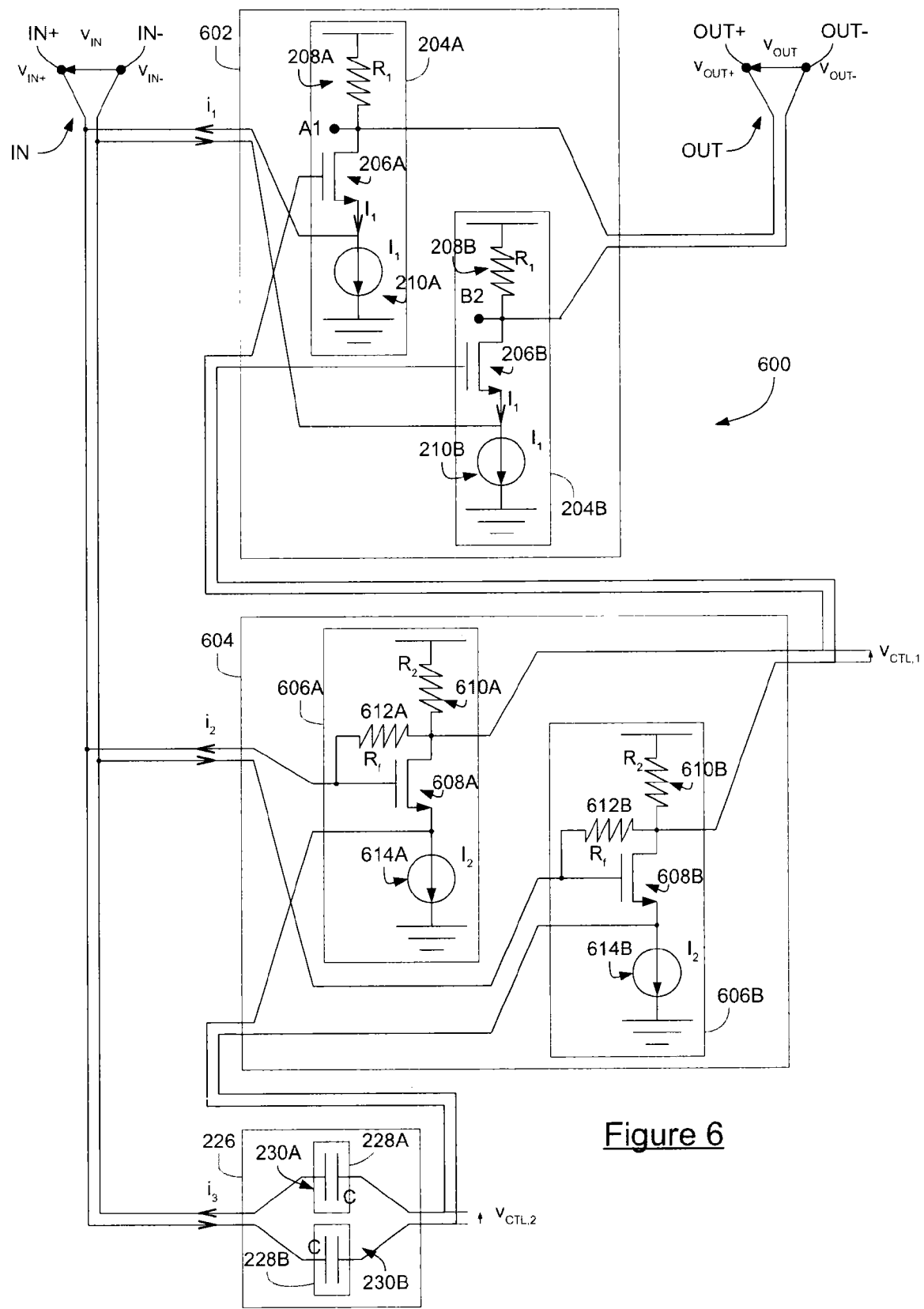
Figure 7:
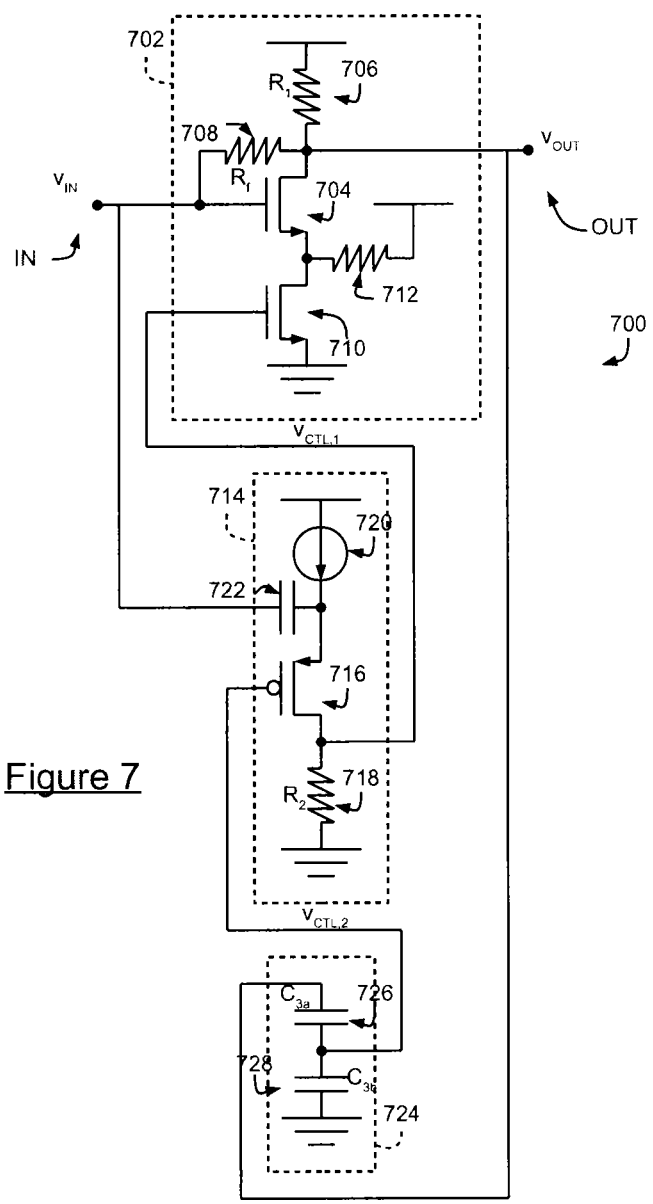
Figure 8:
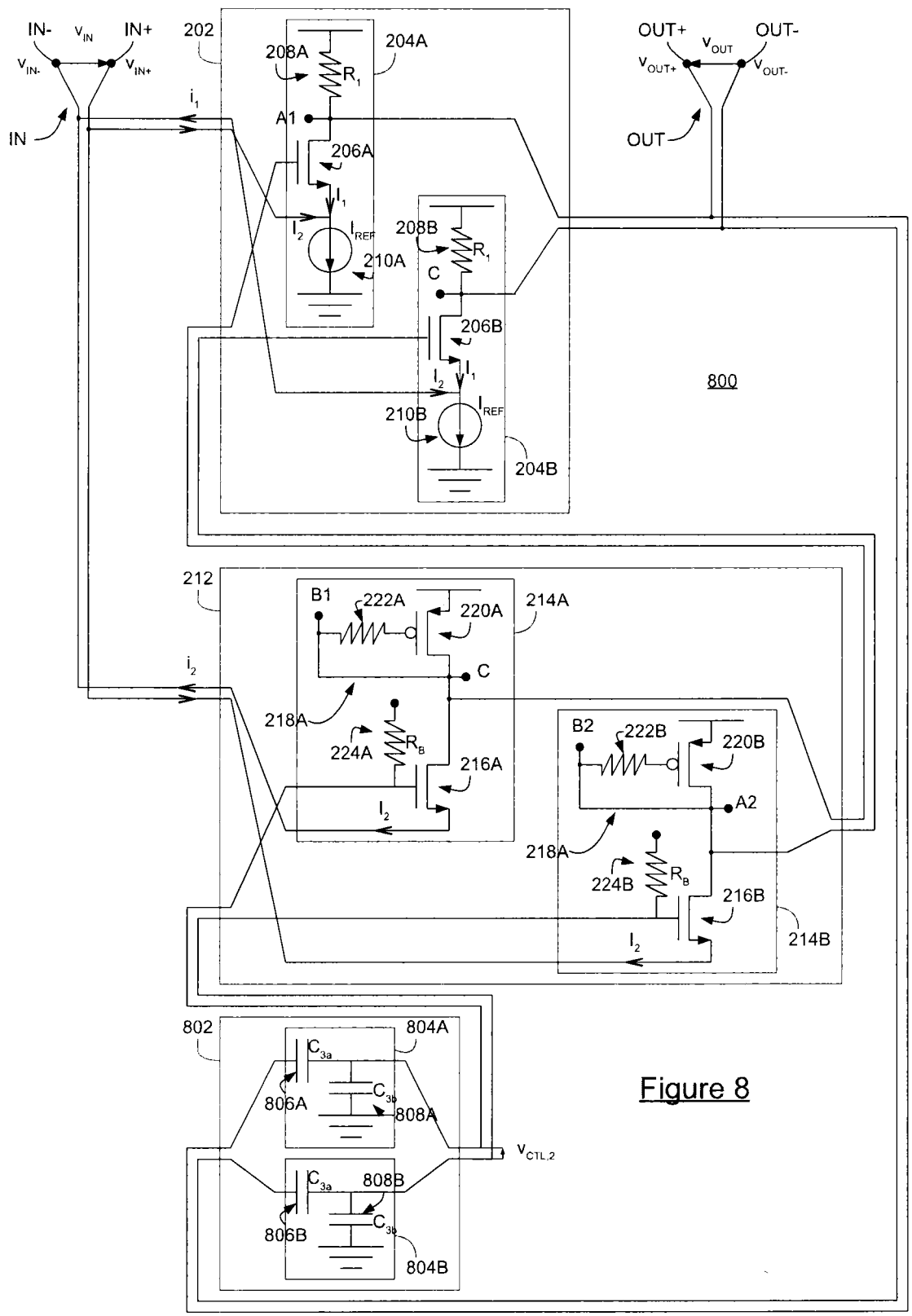

The invention will be understood more clearly using the description hereinafter, given merely as an example and with reference to the appended figures wherein:

FIG. 1 is a functional diagram representing a radiofrequency reception chain,

FIG. 2 is an electrical diagram of an amplification circuit in FIG. 1, according to a first embodiment of the invention, FIG. 3 is an electrical diagram equivalent to that in FIG. 2, for radiofrequency signals, FIG. 4 is an electrical diagram of a first alternative embodiment of the amplification circuit in FIG. 2, FIG. 5 is an electrical diagram of a second alternative embodiment of the amplification circuit in FIG. 2, FIG. 6 is an electrical diagram of an amplification circuit according to a second embodiment of the invention, FIG. 7 is an electrical diagram of an amplification circuit according to a third embodiment of the invention, and FIG. 8 is an electrical diagram of an amplification circuit according to a fourth embodiment of the invention.

With reference to FIG. 1, an example 100 of a reception chain using the invention firstly comprises an antenna 102 for converting electromagnetic waves into an antenna signal.

The reception chain 100 further comprises a radiofrequency filter 104 designed to isolate the useful information in the antenna signal, and an amplification circuit 106 for amplifying the filtered signal.

The amplification circuit 106 is an LNA with the function of amplifying the signal by minimising the degradation of the signal of the antenna 102.

The reception chain 100 further comprises a mixer 108 for mixing the amplified signal with a local oscillator signal so as to obtain a mixed signal, and a low-pass filter 110 for extracting the baseband mixed signal.

The reception chain 100 further comprises a low-frequency adjustable amplifier 112 for increasing the range of the baseband mixed signal if the latter is mixed correctly, but has a poor power. The reception chain 100 comprises an analogue-digital converter 114 for digitising the baseband mixed signal.

With reference to FIG. 2, the amplification circuit 106 firstly comprises an input IN for receiving an input voltage $v_{IN}$. The input IN comprises two input terminals IN+, IN− for receiving the input voltage $v_{IN}$ in the form of a differential voltage comprising two opposite input potentials $v_{IN+}$ and $v_{IN−}$ which have the same amplitude and are 180° phase-shifted, such that $v_{IN}=v_{IN+}-v_{IN-}$.

The amplification circuit 106 further comprises an output OUT for exhibiting an output voltage $v_{OUT}$ corresponding to the amplified input voltage $v_{IN}$. The output OUT comprises two output terminals OUT+, OUT− for supplying the output voltage $v_{OUT}$ in the form of a differential voltage comprising two output potentials $v_{OUT+}$ and $v_{OUT-}$, which have the same amplitude and are 180° phase-shifted.

In order to carry out this amplification, the amplification circuit 106 firstly comprises a primary amplifier 202. The primary amplifier 202 is connected, on one hand, to the input IN for receiving the input voltage $v_{IN}$ and, on the other, to the output OUT in order to supply the amplified input voltage $v_{IN}$ thereto. More specifically, the primary amplifier 202 is designed to amplify the input voltage $v_{IN}$ by a primary gain $G_1$.

The primary gain $G_1$ of the primary amplifier 202 is variable. In order to vary the gain, the primary amplifier 202 is designed to receive a control voltage $v_{CTL,1}$, also in differential form and as such comprising control potentials $v_{CTL+,1}$, $v_{CTL-,1}$ which have the same amplitude and are 180° phase-shifted. The primary amplifier 202 is thus designed so that the gain $G_1$ is dependent on the control voltage $v_{CTL,1}$.

The primary amplifier 202 comprises two primary amplification devices 204A, 204B, each designed to supply one of the respective output potentials $v_{OUT+}$, $v_{OUT-}$ from one of the respective input potentials $v_{IN+}$, $v_{IN-}$. More specifically, the first primary amplification device 204A is designed to supply the output potential $v_{OUT+}$ from the input potential $v_{IN+}$, whereas the second primary amplification device 204B is designed to supply the negative output potential $v_{OUT-}$ from the input potential $v_{IN-}$.

Each primary amplification device 204A, 204B comprises a field-effect transistor 206A, 206B in a common-gate assembly, having a drain, a source and a gate connected as follows.

Each primary amplification device 204A, 204B comprises a resistor 208A, 208B, having the value $R_1$, connecting the drain of the transistor 206A, 206B to a fixed potential $V_{dd}$ (represented by a horizontal line). Each primary amplification device 204A, 204B further comprises a direct current source 210A, 210B connecting the source of the transistor 206A, 206B to a ground of the amplification circuit 106. Moreover, the gate of each transistor 206A, 206B is suitable for receiving one of the respective control potentials $v_{CTL+,1}$, $v_{CTL-,1}$.

Each input terminal IN+, IN− is connected to the source of one of the respective transistors 206A, 206B, whereas each output terminal OUT+, OUT− is connected to the drain of one of the respective transistors 206A, 206B.

In this way, the primary amplification device 204A is designed to amplify the input potential $v_{IN+}$ and to supply, as the output potential $v_{OUT+}$, the input potential amplified this way. Similarly, the primary amplification device 204B is designed to amplify the input potential $v_{IN-}$ and to supply, as the output potential $v_{OUT-}$, the input potential $v_{IN-}$ amplified this way.

The amplification circuit 106 further comprises a secondary amplifier 212 designed to receive the input voltage % from the input IN, to amplify the input voltage $v_{IN}$ by a secondary gain $G_2$, and to supply to the primary amplifier 202, as the primary control voltage $v_{CTL,1}$, the input voltage $v_{IN}$ amplified this way.

The secondary gain $G_2$ of the secondary amplifier 212 is variable. In order to vary the gain, the secondary amplifier 212 is designed to receive a control voltage $v_{CTL,2}$, of which the secondary gain $G_2$ is dependent. The control voltage $v_{CTL,2}$ is also in differential form and as such comprises control potentials $v_{CTL+,2}$, $v_{CTL-,2}$ which have the same amplitude and are 180° phase-shifted.

The secondary amplifier 212 comprises two secondary amplification devices 214A, 214B, each designed to supply one of the respective control potentials $v_{CTL+,1}$, $v_{CTL-,1}$ from one of the respective input potentials $v_{IN-}$, $v_{IN+}$. More specifically, the first secondary amplification device 214A is designed to supply the control potential from the input potential $v_{IN-}$, whereas the second secondary amplification device 214B is designed to supply the control potential $v_{CTL-,1}$ from the input potential $v_{IN+}$.

Each secondary amplification device 214A, 214B comprises a field-effect transistor 216A, 216B in a common-gate assembly, having a drain, a source and a gate connected as follows.

Each secondary amplification device 214A, 214B comprises a variable frequency transistor 218A, 218B connecting the drain of the transistor 216A, 216B to the fixed potential $V_{dd}$. Each variable frequency resistor 218A, 218B comprises a field-effect transistor 220A, 220B and a resistor 222A, 222B. The transistor 220A, 220B has a source connected to the fixed potential $V_{dd}$, a drain connected to the drain of the transistor 216A, 216B of the secondary amplification device 214A, 214B thereof, and a gate connected via the resistor 222A, 222B to the drain thereof. Each secondary amplification device 214A, 214B further comprises a resistor 224A, 224B connecting the gate of the transistor 216A, 216B to a fixed potential $V_{bias}$.

Moreover, the source of each transistor 216A, 216B is connected to one of the respective input terminals IN−, IN+ to receive the corresponding potential. The gate of each transistor 216A, 216B is suitable for receiving one of the respective control potentials $v_{CTL+,2}$, $v_{CTL-,2}$.

The secondary amplification device 214A is thus designed to amplify the input potential $v_{IN-}$ and to supply, as the control potential $v_{CTL+,1}$, the input potential $v_{IN-}$ amplified this way. Similarly, the secondary amplification device 214B is designed to amplify the input potential $v_{IN+}$ and to supply, as the control potential the input potential $v_{IN+}$ amplified this way.

The amplification circuit 106 further comprises three neutralisation connections. More specifically, a first neutralisation connection connects, via a capacitor not shown, the wires of the supply circuit 106 having the potential $v_{CTL-,1}$ to the wires of the supply circuit 106 having the potential $v_{OUT+}$, in order to neutralise at least a portion of the parasitic capacitances found along the wires having the potential $v_{CTL-,1}$. This first neutralisation connection is suitable for connecting the nodes A1 and A2 in the figure.

Similarly, a second neutralisation connection connects, via a capacitor not shown, the wires of the supply circuit 106 having the potential $v_{CTL+,1}$ to the wires of the supply circuit 106 having the potential $v_{OUT-}$, in order to neutralise at least a portion of the parasitic capacitances found along the wires having the potential $v_{CTL+,1}$. This second neutralisation connection is suitable for connecting the nodes B1 and B2 in the figure.

Furthermore, a third neutralisation connection connects the respective gates of the transistors 220A, 220B, so as to at least partially neutralise the active inductor present in the variable frequency resistors 218A, 218B. This third neutralisation connection is suitable for connecting the nodes with the same name C in the figure.

The amplification circuit 106 further comprises a tertiary amplification device 226 designed to amplify, by a tertiary gain $G_3$, a tertiary input voltage dependent on the input voltage $v_{in}$, and to supply, as a secondary control voltage $v_{CTL,2}$, the amplified tertiary input voltage. In the amplification circuit 106, the tertiary input voltage is the input voltage $v_{in}$.

More specifically, the tertiary amplifier 226 comprises two tertiary amplification devices 228A, 228B each designed to supply one of the respective control potentials $v_{CTL+,2}$, $v_{CTL-,2}$ from one of the respective input potentials $v_{IN+}$, $v_{IN-}$.

In the amplification circuit 106, the tertiary amplification device 228A supplies the control potential $v_{CTL+,2}$ from the input potential $v_{IN+}$, whereas the tertiary amplification device 228B supplies the control potential $v_{CTL-,2}$ from the input potential $v_{IN-}$.

Each tertiary amplification device 228A, 228B comprises a capacitor 230A, 230B connecting the respective input terminal IN+, IN− to the gate of the transistor 216A, 216B of the respective secondary amplification device 214A, 214B.

To understand the operation of the amplification circuit 106 when it amplifies an input voltage $v_{IN}$ which is a radiofrequency signal, only the radiofrequency electrical signals are to be taken into consideration. In this way, in FIG. 3, all the electrical components supplying a DC potential or a direct current have been omitted. Similarly, as a capacitor having a sufficiently high value for the radiofrequency electrical signals in question acts, for these radiofrequency electrical signals, as a mere connection, the capacitors have been replaced by direct connections. Finally, the variable frequency resistors 218A, 218B are represented by mere resistors having the value $R_2$.

The operation of the amplification circuit 106 will now be described.

The field-effect transistors are firstly polarised by DC potentials $V_{dd}$, $V_{BIAS}$ and by direct current sources 210A, 210B generating direct currents having the same value $I_{REF}$.

More specifically, the current $I_{REF}$ is split into two direct currents $I_1$ and $I_2$ passing through the transistors 206A and 216B or 206B and 216A, respectively. These two currents $I_1$ and $I_2$ represent most of the consumption of the amplification circuit 106.

The polarisation of each transistor 206A, 206B is performed by choosing the value $R_1$ of the resistors 208A, 208B, by choosing the size of the transistor and the source-gate DC voltage applied to the transistor. The first two parameters can be set independently of the other components in the circuit. However, the gate voltage of each transistor 206A, 206B is directly correlated with the drain voltage of the transistor 216A, 216B to which it is connected. In this way, there is a dependency between the source-gate voltage of the transistors 206A, 206B and the setting parameters of the transistors 216A, 216B.

The polarisation of the transistors 216A, 216B is performed by choosing the source-gate voltage thereof, by choosing the size thereof and by choosing the value of the variable frequency resistors 218A, 218B. The source-gate voltages are set by the DC potential $V_{BIAS}$.

In an alternative embodiment not shown, it is possible to separate the polarisation conditions of the transistors 206A, 216A (or 206B, 216B) by adding a connecting capacitor between the drain of the transistor 216A (respectively 216B) and the gate of the transistor 206A (respectively 206B), in order to set different DC potentials at these two points.

Following the previous polarisation, the transistors 206A, 206B exhibit the same transconductance $g_{m1}$, whereas the transistors 216A, 216B exhibit the same transconductance $g_{m2}$.

Hereinafter, a radiofrequency voltage $v_{IN}$ is received on the input IN of the amplification device 106.

A current $i_2$ is then output from the secondary amplifier 212 to the terminal IN−. The current $i_2$ equals:

$$i_2 = g_{m2}(v_{CTL+,2} - v_{IN-}) = 2g_{m2}v_{IN+}$$

as $$v_{CTL+,2} = v_{IN+}$$

and $$v_{IN-} = -v_{IN+}$$

The same current $i_2$ is input to the amplifier 212 from the terminal IN+.

In this way, in operation, the secondary amplifier 212 exhibits a non-zero input admittance $g_2$ equal to:

$$g_2 = \frac{i_2}{v_{IN}} = \frac{i_2}{2v_{IN+}} = g_{m2}$$

In practice, this means that the amplification circuit is designed such that the admittance $g_2$ has a value of at least 1 millisiemens, preferably at least 10 millisiemens, and more preferably at least 20 millisiemens if seeking to reduce the input impedance considerably.

Furthermore, a current $i_1$ is output from the primary amplifier 202 to the terminal IN−. The current $i_1$ equals:

$$i_1 = g_{m1}(v_{CTL-,1} - v_{IN-})$$

i.e.:

$$i_1 = g_{m1}(1 + 2R_2g_{m2})v_{IN+}$$

as $$v_{IN-} = -v_{IN+}$$

and $$v_{CTL-,1} = 2R_2g_{m2}v_{IN+}$$

The same current $i_2$ is input to the amplifier 212 from the terminal IN+.

In this way, in operation, the primary amplifier 202 exhibits a non-zero input admittance $g_1$ equal to:

$$g_1 = \frac{i_1}{v_{IN}} = \frac{1}{2}g_{m1}(1 + 2R_2g_{m2})$$

In practice, this means that the amplification circuit 106 is designed such that the admittance $g_1$ has a value of at least 1 millisiemens, preferably at least 10 millisiemens, and more preferably at least 20 millisiemens if seeking to reduce the input impedance considerably.

In this way, the amplification circuit 106 exhibits an input admittance g equal to:

$$g = g_1 + g_2 =$$

$$\frac{1}{2}g_{m1}(1 + 2R_2g_{m2}) + g_{m2} = g_1(1 + 2R_2g_{m2}) + g_{m2} \quad \text{where} \quad \underline{g_1} = \frac{1}{2}g_{m1}$$

is the admittance of the primary amplifier 202 in the absence of a secondary amplifier 212 ($g_{m2}$ equal to zero). It is as such possible to obtain a high input admittance and therefore a low input impedance (preferably 50Ω), without the electricity consumption being high since the transconductances $g_{m1}$ and $g_{m2}$ remain moderate.

More specifically, the proposed configuration makes it possible to add two further contributions to the input admittance $\underline{g_1}$ presented by the primary amplifier 202 in the absence of a secondary amplifier 212.

The first contribution consists of the factor $(1+2R_2g_{m2})$ obtained from the gain increase applied by the presence of the secondary amplifier 212.

The second contribution consists of the term $g_{m2}$ obtained from the generation of the current $i_2$, and benefiting from CCCT (the tertiary amplifier 226).

Moreover, the input impedance of the amplification circuit 106 also has an imaginary part, particularly an inductive part, from an impedance gyrator effect. This effect causes the appearance of an inductive imaginary part in the input admittance, this imaginary part being proportional to the admittance of the variable frequency resistors 218A, 218B, due to the presence of non-zero capacitors in the transistors 206A, 206B. Preferably, this inductive part is advantageously used with a parasitic capacitance at the input to increase the breadth of the range of frequencies on which the amplification circuit 106 is suitable.

The gain $G_1$ may be determined as follows.

The tertiary amplifier 226 supplies a secondary control voltage $V_{CTL,2}$ equal to $-G_3 \cdot v_{IN}$, where $G_3$ equals 1.

The secondary amplifier 212 supplies a primary control voltage $v_{CTL,1}$ equal to $G_2 \cdot v_{IN}$, where $G_2$ equals:

$$G_2 = (1+G_3)R_2 g_{m2} = (1+G_3)\underline{G_2}$$

where $\underline{G_2} = R_2 g_{m2}$ is the secondary gain without tertiary amplification, i.e. when $G_3 = 0$.

The primary amplifier 202 supplies an output voltage $v_{OUT}$ equal to:

$$v_{OUT} = G_1 v_{IN}$$

where $G_1$ equals:

$$G_1 = (1+G_2)R_1 g_{m1}$$

or $$G_1 = (1+G_2)\underline{G_1}$$

where $\underline{G_1} = R_1 g_{m1}$ is the primary gain without secondary amplification, i.e. when $G_2 = 0$.

The primary gain may further be expressed as follows:

$$G_1 = \underline{G_1} + (1+G_3)\underline{G_1}\underline{G_2}$$

As $G_3$ equals 1, the primary gain $G_1$ equals:

$$G_1 = \underline{G_1} + 2\underline{G_1}\underline{G_2} = \underline{G_1}(1+2\underline{G_2})$$

In this way, the gain $\underline{G_1}$ is increased by a factor $(1+2 \cdot \underline{G_2})$ where $\underline{G_2}$ is the gain of the secondary amplifier alone, in turn increased by a factor of two through the presence of CCCT (the tertiary amplifier 226).

It should be noted that the above gain and admittance calculations are carried out based on simple modelling of the components of the circuit. More specifically, this simplified modelling ignores the impact of the parasitic capacities and finite conductances of the transistors used in the circuit.

With reference to FIG. 4, a first alternative embodiment 400 of the amplification circuit 106 is illustrated, this alternative embodiment 400 being suitable for use in the reception chain 100 instead of the amplification circuit 106.

This alternative embodiment 400 differs from the amplification circuit 106 in that it comprises, in addition to all the components in the amplification circuit 106, a continuous feedback loop 402.

The continuous feedback loop 402 comprises two resistors 404, 406 in succession interconnecting the drains of the transistors 206A, 206B.

The continuous feedback loop 402 further comprises an operational amplifier 408 having an output connected to the fixed potential $V_{BIAS}$, a negative input connected between the resistors 404, 406 and a positive input connected as explained hereinafter.

The continuous feedback loop 402 further comprises a resistor 410 having the value $R_1$ connecting the positive input of the operational amplifier to the fixed potential $V_{dd}$ and a direct current source 412 connecting the positive input of the operational amplifier 408 to the ground and generating a current having the value $I_1$ towards the ground.

By means of the continuous feedback loop 402, the distribution of the current $I_{REF}$ between $I_1$ and $I_2$ is less sensitive to the DC potential applied to the gate of the field-effect transistors 216A, 216B than in the amplification circuit 106.

With reference to FIG. 5, a second alternative embodiment 500 of the amplification circuit 106 is illustrated, this alternative embodiment 500 being suitable for use in the reception chain 100 instead of the amplification circuit 106.

This alternative embodiment 500 differs from the amplification circuit 106 in that it comprises direct current sources 502A, 502B, 504A, 504B to generate the currents $I_1$ and $I_2$ separately.

More specifically, the direct current source 502A connects the input IN− to the ground and generates the current $I_1$ towards the ground. The direct current source 504A connects the source of the field-effect transistor 216A to the ground and generates the current $I_2$ towards the ground.

So that the potential $v_{IN+}$ continues to be applied to the source of the transistor 216A without the current source 502A influencing the static current of the transistor 216A, the alternative embodiment 500 further comprises a capacitor 506A connecting the direct current source 504A to the input IN− and to the direct current source 502A.

Symmetrically, the direct current source 502B connects the input IN+ to the ground and generates the current $I_1$ towards the ground. The direct current source 504B connects the source of the transistor 216B to the ground and generates the current $I_2$ towards the ground. The alternative embodiment 500 further comprises a capacitor 506B connecting the direct current source 504B to the input IN+ and to the direct current source 502B.

In this way, it is possible to set the currents $I_1$ and $I_2$ independently from each other.

With reference to FIG. 6, an amplification circuit 600 according to a second embodiment of the invention is illustrated. This alternative embodiment 600 may be used in the reception chain 100 instead of the amplification circuit 106.

The amplification circuit 600 comprises three amplifiers as in the amplification circuit 106, of which only the second is different.

In this way, the secondary amplifier, now bearing the reference 604, comprises two secondary amplification devices 606A, 606B, each designed to supply one of the respective control potentials $v_{CTL+,1}$, $v_{CTL-,1}$ from one of the respective input potentials $v_{IN+}$, $v_{IN-}$. More specifically, the first secondary amplification device 606A is designed to supply the control potential $v_{CTL+,1}$ from the input potential $v_{IN+}$, whereas the second secondary amplification device 606B is designed to supply the negative control potential $v_{CTL-,1}$ from the negative input potential $v_{IN-}$.

Each secondary amplification device 606A, 606B comprises a field-effect transistor 608A, 608B in a common-gate assembly having the same transconductance $g_{m2}$ and with a resistive feedback loop. More specifically, each transistor 608A, 608B has a drain, a source and a gate connected as follows.

Each secondary amplification device 606A, 606B comprises a resistor 610A, 610B having the value $R_2$ connecting the drain of the transistor 608A, 608B to the fixed potential $V_{dd}$, and a resistor 612A, 612B having the value $R_f$ connecting the drain of the transistor 608A, 608B to the gate and acting as the resistive feedback loop.

Moreover, the gate of each transistor 608A, 608B is connected to one of the respective input terminals IN−, IN+ to receive the corresponding potential. The source of each transistor 608A, 608B is suitable for receiving one of the respective control potentials $v_{CTL+,2}$, $v_{CTL-,2}$.

Finally, each secondary amplification device 606A, 606B comprises a direct current source 614A, 614B connecting the source of the transistor 608A, 608B to the ground, and generating the direct current $I_2$ towards the ground for the polarisation of the transistor 608A, 608B.

Moreover, following the modification of the secondary amplifier 212, the direct current sources 210A, 210B of the primary amplifier 202 now generate the polarisation current $I_1$ of the transistors 206A, 206B, but no longer the polarisation current $I_2$.

Furthermore, again following the modification of the secondary amplifier 212, a current $i_3$ flows between the tertiary amplifier 226 and the input IN.

After polarisation, the transistors 206A, 206B exhibit a transconductance equal to $g_{m1}$, whereas the transistors 608A, 608B exhibit a transconductance equal to $g_{m2}$.

In this embodiment, again using simple modelling of the circuit components, the input admittance of the primary amplifier 602 equals:

$$g_1 = \frac{i_1}{v_{IN}} = \frac{g_{m1}}{2}\left[1 + \frac{2g_{m2}R_2 - g_f R_2}{1 + g_f R_2}\right] \text{ with:}$$

$$g_f = \frac{1}{R_f}$$

Furthermore, the input admittance of the secondary amplifier 604 equals:

$$g_2 = \frac{i_2}{v_{IN}} = \frac{g_f}{2}\left[1 + \frac{2g_{m2}R_2 - g_f R_2}{1 + g_f R_2}\right]$$

Furthermore, the input admittance of the tertiary amplifier 226 equals:

$$g_3 = \frac{i_3}{v_{IN}} = g_{m2}$$

In this way, the input admittance of the amplification circuit 600 equals:

$$g = g_1 + g_2 + g_3 = \frac{(g_{m1} + g_f)}{2}\left[1 + \frac{2g_{m2}R_2 - g_f R_2}{1 + g_f R_2}\right] + g_{m2}$$

Moreover, the gain $G_1$ of the primary amplifier 602 equals:

$$G_1 = \frac{v_{OUT}}{v_{IN}} = (g_{m1} + g_f)\left[1 + \frac{2g_{m2}R_2 - g_f R_2}{1 + g_f R_2}\right]$$

With reference to FIG. 7, an amplification circuit 700 according to a further embodiment of the invention is illustrated. This alternative embodiment 700 may be used in the reception chain 100 instead of the amplification circuit 106.

The amplification circuit 700 comprises three amplifiers as for the amplification circuit 106, but is designed to receive the input voltage $v_{IN}$ in single-potential form and to supply the output voltage $v_{OUT}$ also in single-potential form.

In this way, the amplification circuit 700 firstly comprises an input IN for receiving the input voltage $v_{IN}$. The input IN comprises a single input terminal for receiving the input voltage $v_{IN}$ in the form of a single-potential voltage.

The amplification circuit 700 further comprises an output OUT for exhibiting an output voltage $v_{OUT}$ corresponding to the amplified input voltage $v_{IN}$. The output OUT comprises a single output terminal for supplying the output voltage $v_{OUT}$ in the form of a single-potential voltage.

In order to carry out this amplification, the amplification circuit 700 firstly comprises a primary amplifier 702. The primary amplifier 702 is connected, on one hand, to the input IN for receiving the input voltage $v_{IN}$ and, on the other, to the output OUT in order to supply the amplified input voltage $v_{IN}$ thereto. More specifically, the primary amplifier 702 is designed to amplify the input voltage $v_{IN}$ by a primary gain $G_1$.

The primary gain $G_1$ of the primary amplifier 702 is variable. In order to vary the gain, the primary amplifier 702 is designed to receive a control voltage $v_{CTL,1}$, also in single-potential form. The primary amplifier 702 is thus designed so that the gain $G_1$ is dependent on the control voltage $v_{CTL,1}$.

The primary amplifier 702 comprises a field-effect transistor 704 in a common source assembly with a resistive feedback loop. More specifically, the transistor 704 has a drain, a source and a gate connected as follows.

The primary amplifier 702 comprises a resistor 706 connecting the drain of the transistor 704 to the fixed potential $V_{dd}$. The primary amplifier 704 further comprises a resistor 708 connecting the drain of the transistor 704 to the gate thereof, and acting as the resistive feedback loop. Moreover, the gate of the transistor 704 is connected to the input IN for receiving the input voltage $v_{IN}$. The primary amplifier 702 further comprises a variable resistor consisting of a field-effect transistor 710 having a drain connected to the source of the transistor 704, a source connected to the ground, and, in addition, a resistor 712 connecting the drain of the transistor 710 to the fixed potential $V_{dd}$. The variable resistor is suitable for receiving the control voltage $v_{CTL,1}$ on the gate of the transistor 710 to vary the resistance.

The amplification circuit 700 further comprises a secondary amplifier 714 designed to receive the input voltage $v_{IN}$ from the input IN, amplify the input voltage $v_{IN}$ by a secondary gain $G_2$, and supply to the primary amplifier 702, as the control voltage $v_{CTL,1}$, the input voltage $v_{IN}$ amplified this way.

The secondary gain $G_2$ of the secondary amplifier 714 is variable. In order to vary the gain, the secondary amplifier 714 is designed to receive a control voltage $v_{CTL,2}$, whereon the secondary gain $G_2$ is dependent. The control voltage $v_{CTL,2}$ is also in single-potential form.

The secondary gain 714 comprises a field-effect transistor 716 in a common gate assembly. The transistor 716 has a drain, a source and a gate connected as follows.

The secondary amplifier 714 comprises a resistor 718 having the value $R_3$ connecting the drain of the field-effect transistor 716 to the ground.

The secondary amplifier 714 further comprises a direct current source 720 connecting the source of the transistor 716 to the fixed potential $V_{dd}$, and generating a current $I_2$ from the fixed potential $V_{dd}$ and to the source of the field-effect transistor 716.

The secondary amplifier 714 further comprises a connection capacitor 722 connecting the source of the transistor 716 to the input IN in order to receive the input voltage $v_{IN}$.

The amplification circuit 700 further comprises a tertiary amplification device 724 designed to amplify a tertiary input voltage dependent on the input voltage $v_{in}$ by a tertiary gain $G_3$, and to supply, as the control voltage $v_{CTL,2}$, the tertiary input voltage amplified this way. In the amplification circuit 700, the tertiary input voltage is the output voltage $v_{OUT}$.

More specifically, the tertiary amplifier 724 comprises two capacitors 726, 728 in a capacitive divider bridge assembly. The two capacitors 726, 728 are thus arranged in succession and connect the output OUT to the ground. Moreover, the gate of the transistor 716 is connected between the two capacitors 726, 728 to receive the control voltage $v_{CTL,2}$.

After polarisation, the transistor 704 exhibits a transconductance equal to $g_{m1a}$, the transistor 710 exhibits a transconductance equal to $g_{m1b}$ and the transistor 716 exhibits a transconductance equal to $g_{m2}$.

Still using simple modelling of the circuit components, the gain $G_1$ of the primary amplifier 702 equals:

$$G_1 = \frac{v_{OUT}}{v_{IN}} = \frac{-(g_{m1a} - g_f)(g_{m1a} + g_2) - g_{m1a}(g_{m1b}g_{m2}a - g_{m1a})}{(g_1 + g_f)(g_{m1a} + g_2) - g_{m1a}(g_{m1b}g_{m2}R_3a)}$$

with $$a = \frac{C_{3a}}{C_{3a} + C_{3b}}, g_2 = \frac{1}{R_2} \text{ and } g_f = \frac{1}{R_f}.$$

Furthermore, the input admittance of the primary amplifier equals:

$$g_1 = \frac{i_1}{v_{IN}} = g_f(1 - G_1)$$

Furthermore, the input admittance of the secondary amplifier 714 equals:

$$g_2 = \frac{i_2}{v_{IN}} = g_{m2}(1 - aG_1)$$

In this way, the input admittance of the amplification circuit 700 equals:

$$g = g_1 + g_2 = g_f(1 - G_1) + g_{m2}(1 - aG_1)$$

With reference to FIG. 8, an amplification circuit 800 according to a further embodiment of the invention is illustrated. This alternative embodiment 800 may be used in the reception chain 100 instead of the amplification circuit 106.

The amplification circuit 800 is identical to the amplification circuit 106, apart from the tertiary amplifier now bearing the reference 802.

The tertiary amplifier 802 is designed to amplify a tertiary input voltage dependent on the input voltage $v_{IN}$ by a tertiary gain $G_3$, and to supply, as the control voltage $v_{CTL,2}$, the tertiary input voltage amplified this way. In the amplification circuit 800, the tertiary input voltage is the output voltage $v_{OUT}$.

More specifically, the tertiary amplifier 802 comprises two tertiary amplification devices 804A, 804B each designed to supply one of the respective secondary control potentials $v_{CTL+,2}$, $v_{CTL-,2}$ from one of the respective output potentials $v_{OUT+}$, $v_{OUT-}$. In the amplification circuit 800, the tertiary amplification device 804A supplies the secondary control potential $v_{CTL+,2}$ from the output potential $v_{OUT+}$, whereas the tertiary amplification device 804B supplies the secondary control potential $v_{CTL-,2}$ from the output potential $v_{OUT-}$.

Each tertiary amplification device 804A, 804B comprises two capacitors 806A, 808A, respectively 806B, 808B, having the respective values $C_{3a}$ and $C_{3b}$, in a capacitive divider bridge assembly. The two capacitors 806A, 808A, respectively 806B, 808B, are thus arranged in succession and connect the output OUT+, respectively OUT-, to the ground. Moreover, the gate of the transistor 216A, or 216B, is connected between the two capacitors 806A, 808A, respectively 806B, 808B, to receive the control potential $v_{CTL+,2}$, or $v_{CTL-,2}$.

After polarisation, the transistors 206A, 206B exhibit a transconductance equal to $g_{m1}$, whereas the transistors 216A, 216B exhibit a transconductance equal to $g_{m2}$. Furthermore, the variable frequency resistors 218A, 218B equal $R_2$.

Again using simple modelling of the circuit components, the input admittance of the primary amplifier equals:

$$g_1 = \frac{i_1}{v_{IN}} = \frac{g_{m1}}{2}(1 + g_{m2}R_2(1 + aG_1))$$

with $$a = \frac{C_{3a}}{C_{3a} + C_{3b}}$$

and $G_1$ is the gain of the primary amplifier.

The input admittance of the secondary amplifier equals:

$$g_2 = \frac{i_2}{v_{IN}} = \frac{g_{m2}}{2}(1 + aG_1)$$

In this way, the input admittance of the amplification circuit equals:

$$g = g_1 + g_2 = \frac{g_{m1}}{2}(1 + g_{m2}R_2(1 + aG_1)) + \frac{g_{m2}}{2}(1 + aG_1)$$

Moreover, the gain $G_1$ of the primary amplifier equals:

$$G_1 = g_{m1}R_1 \frac{(1 + g_{m2}R_2)}{1 - g_{m1}g_{m2}R_2R_1a}$$

It is obvious that an amplification circuit according to the invention is suitable for obtaining a very advantageous input admittance to electricity consumption ratio.

In particular, the examples given above describe the scenario where the secondary amplifier comprises a transistor on the source whereof each input potential ($v_{IN}$, or $v_{IN-}$ and $v_{IN+}$ depending on the case) is received, helping obtain the high input admittance (i.e. greater than 1 mS) of the secondary amplifier.

Moreover, the invention is not restricted to the embodiments described above, but, on the contrary, defined by the claims hereinafter.

It would be obvious to those skilled in the art that various modifications may be made to the embodiments described above, in the light of the teaching disclosed herein.

In the claims hereinafter, the terms used should not be interpreted as restricting the claims to the embodiments disclosed in the present description, but should be interpreted to include any equivalents intended to be covered by the claims due to the wording thereof and which may be envisaged by those skilled in the art by applying their general knowledge to the implementation of the teaching disclosed herein.

The invention is:
1. An amplification circuit, comprising:
an input for receiving an input voltage;
an output for exhibiting an output voltage;
a primary amplifier configured to:

receive the input voltage from the input,
receive a primary control voltage,
first amplify the input voltage by a primary gain, by amplifying a difference between the input voltage and the primary control voltage, the output voltage corresponding to the first amplified input voltage, and
supply the output voltage to the output;
a secondary amplifier configured to:
receive the input voltage from the input,
second amplify the input voltage by a secondary gain, the primary control voltage corresponding to the second amplified input voltage, and
supply the primary control voltage to the primary amplifier;
wherein the secondary amplifier has in operation an input admittance of at least 1 millisiemens.

2. The amplification circuit according to claim 1, wherein the primary amplifier has in operation an input admittance of at least 1 millisiemens.

3. The amplification circuit according to claim 1, wherein the secondary gain is strictly greater in absolute terms than 1.

4. The amplification circuit according to claim 1, wherein:
the secondary amplifier is configured to receive a secondary control voltage, and second amplify the input voltage by the secondary gain by amplifying a difference between the input voltage and the secondary control voltage; and
the amplification circuit further comprising a tertiary amplifier configured to amplify a tertiary input voltage dependent on the input voltage by a tertiary gain, the secondary control voltage corresponding to the tertiary amplified input voltage.

5. The amplification circuit according to claim 4, wherein the tertiary gain is equal in absolute terms to 1.

6. The amplification circuit according to claim 4, wherein the tertiary gain is strictly less in absolute terms than 1.

7. The amplification circuit according to claim 4, wherein the tertiary input voltage is the input voltage.

8. The amplification circuit according to claim 4, wherein the tertiary input voltage is the output voltage.

9. The amplification circuit according to claim 1, wherein the input voltage and/or the output voltage is/are in differential form.

10. A reception chain, comprising:
an antenna configured to receive a radiofrequency signal and convert the received radiofrequency signal into an antenna voltage;
the amplification circuit according to claim 1, configured to receive an input voltage from the antenna voltage.

11. The amplification circuit according to claim 1, wherein:
the primary amplifier comprises a common-gate field-effect transistor comprising a source, a gate and a transconductance,
the common-gate field-effect transistor receives a potential of the input voltage on its source and a potential of the primary control voltage on its gate so that amplifying the difference between the input voltage and the primary control voltage is dependent on its transconductance.

* * * * *